(12) United States Patent
Matsuo

(10) Patent No.: US 12,738,710 B2
(45) Date of Patent: Sep. 15, 2026

(54) LIGHT-EMITTING DEVICE INCLUDING SEMICONDUCTOR LASER ELEMENT ENCAPSULATED BY BASE AND COVER WITH TWO LEAD TERMINALS PENETRATING THROUGH LATERAL WALL OF BASE

(71) Applicant: NICHIA CORPORATION, Anan (JP)

(72) Inventor: Hidenori Matsuo, Hadano (JP)

(73) Assignee: NICHIA CORPORATION, Anan (JP)

( * ) Notice: Subject to any disclaimer, the term of this patent is extended or adjusted under 35 U.S.C. 154(b) by 856 days.

(21) Appl. No.: 18/176,840

(22) Filed: Mar. 1, 2023

(65) Prior Publication Data

US 2023/0283041 A1 Sep. 7, 2023

(30) Foreign Application Priority Data

Mar. 3, 2022 (JP) ................................ 2022-032522

(51) Int. Cl.
*H01S 5/02375* (2021.01)
*H01S 5/02208* (2021.01)
(Continued)

(52) U.S. Cl.
CPC ...... *H01S 5/02375* (2021.01); *H01S 5/02208* (2013.01); *H01S 5/02253* (2021.01);
(Continued)

(58) Field of Classification Search
CPC ............. H01S 5/02375; H01S 5/02208; H01S 5/02253; H01S 5/02315; H01S 5/02325;
(Continued)

(56) References Cited

U.S. PATENT DOCUMENTS

2011/0291111 A1* 12/2011 Nagai ................ H01L 23/3114 257/676
2012/0044967 A1* 2/2012 Cole ..................... G11B 5/105 372/92
(Continued)

FOREIGN PATENT DOCUMENTS

JP 2000-098190 A 4/2000
JP 2006-253288 A 9/2006
(Continued)

*Primary Examiner* — M. A. Golub-Miller
(74) *Attorney, Agent, or Firm* — Spencer Fane LLP

(57) ABSTRACT

A light-emitting device includes a semiconductor laser element, a base, a cover, and two lead terminals. The base has a bottom portion supporting the semiconductor laser element and a lateral wall surrounding the semiconductor laser element with the lateral wall being bonded to the bottom portion. The lateral wall includes a light-transmitting portion configured to transmit a laser beam emitted from the semiconductor laser element. The cover and the base together define an encapsulation space in which the semiconductor laser element is encapsulated. The two lead terminals penetrate through the lateral wall of the base, one end of each of the lead terminals being located inside the encapsulation space. The bottom portion of the base has an upper surface defining a recessed portion located between the two lead terminals as viewed from above. The recessed portion has a flat bottom surface over which the semiconductor laser element is placed.

7 Claims, 9 Drawing Sheets

(51) Int. Cl.

*H01S 5/02253* (2021.01)
*H01S 5/02315* (2021.01)
*H01S 5/02325* (2021.01)
*H01S 5/02355* (2021.01)
*H01S 5/0237* (2021.01)
*H01S 5/024* (2006.01)

(52) U.S. Cl.

CPC ...... *H01S 5/02315* (2021.01); *H01S 5/02325* (2021.01); *H01S 5/0237* (2021.01); *H01S 5/02355* (2021.01); *H01S 5/02469* (2013.01)

(58) Field of Classification Search

CPC . H01S 5/0237; H01S 5/02355; H01S 5/02469
See application file for complete search history.

(56) References Cited

U.S. PATENT DOCUMENTS

2013/0170204 A1* 7/2013 Sasamuro ........... H01S 5/02253 362/235
2013/0249100 A1 9/2013 Morishita et al.
2015/0257252 A1* 9/2015 Kato ................... H01L 23/3735 174/268
2017/0179355 A1 6/2017 Oka
2017/0331248 A1* 11/2017 Lambert ................ G02B 6/122
2018/0219350 A1* 8/2018 Möhrle ..................... H01S 5/12
2019/0097388 A1* 3/2019 Matsuo ............... H01S 5/02234
2020/0273762 A1* 8/2020 Yamazaki ............ B23K 20/021
2021/0203127 A1* 7/2021 Matsuo ............... H01S 5/02212
2022/0416501 A1* 12/2022 Matsuo ............... H01S 5/02315
2022/0416502 A1* 12/2022 Matsuo ............... H01S 5/02326
2023/0035065 A1* 2/2023 Matsubara .............. H01S 5/023
2024/0154384 A1* 5/2024 Wu ..................... H01S 5/02326
2025/0112438 A1* 4/2025 Hatakeyama ....... H01S 5/02257

FOREIGN PATENT DOCUMENTS

JP 2009-130185 A 6/2009
JP 2010-062203 A 3/2010
JP 2013-197432 A 9/2013
JP 2016-012626 A 1/2016
JP 2017-117831 A 6/2017
JP 2021-106247 A 7/2021
WO 2018/173394 A1 9/2018

* cited by examiner

LIGHT-EMITTING DEVICE INCLUDING SEMICONDUCTOR LASER ELEMENT ENCAPSULATED BY BASE AND COVER WITH TWO LEAD TERMINALS PENETRATING THROUGH LATERAL WALL OF BASE

CROSS REFERENCE TO RELATED APPLICATION

This application claims priority to Japanese Patent Application No. 2022-032522, filed on Mar. 3, 2022, the disclosure of which is hereby incorporated herein by reference in its entirety.

BACKGROUND

The present disclosure relates to a light-emitting device, a method for producing a package, and a method for producing a light-emitting device.

Light-emitting devices including semiconductor laser elements can be used in devices such as laser processing machines, projectors, and light sources for lighting devices. In such light-emitting devices, the optical axis of an outgoing laser beam may deviate from the designed optical axis due to errors in manufacture or structural deformation in the process of manufacture.

In the present specification, Japanese Patent Publication No. 2000-98190 is also incorporated by reference in its entirety.

SUMMARY

Suppressing deviation of the optical axis of a laser beam outgoing from the light-emitting device has been demanded.

According to one embodiment, a light-emitting device includes a semiconductor laser element, a base, a cover, and two lead terminals. The base has a bottom portion supporting the semiconductor laser element and a lateral wall surrounding the semiconductor laser element with the lateral wall being bonded to the bottom portion. The lateral wall includes a light-transmitting portion configured to transmit a laser beam emitted from the semiconductor laser element. The cover and the base together define an encapsulation space in which the semiconductor laser element is encapsulated. The two lead terminals penetrate through the lateral wall of the base, one end of each of the lead terminals being located inside the encapsulation space. The bottom portion of the base has an upper surface defining a recessed portion located between the two lead terminals as viewed from above. The recessed portion has a flat bottom surface over which the semiconductor laser element is placed.

According to one embodiment, a method for producing a package of the present disclosure includes: providing a package main body including a base and two lead terminals, the base having a bottom portion and a lateral wall defining a space for housing a semiconductor laser element, the two lead terminals penetrating through the lateral wall, one end of each of the lead terminals being located inside the space; and pressing down a predetermined region of an upper surface of the bottom portion by a press machine through a gap between the two lead terminals, thereby forming a recessed portion in the upper surface of the bottom portion such that the recessed portion has a flat bottom surface.

According to one embodiment, a method for producing a light-emitting device of the present disclosure includes: producing a package by the method for producing a package as described above; and placing the semiconductor laser element over the bottom surface of the recessed portion.

According to an embodiment of the present disclosure, it is possible to suppress deviation of the optical axis of a laser beam outgoing from the light-emitting device.

DETAILED DESCRIPTION

Hereinafter, a light-emitting device, a method for producing a package, and a method for producing a light-emitting device according to certain embodiments of the present disclosure will be described with reference to the drawings. The same reference signs in a plurality of drawings denote the same or similar parts.

The embodiments described below are intended to give a concrete form to the technical ideas of the present invention, but the scope of the present invention is not intended to be limited thereto. The size, material, shape, relative arrangement, etc., of the components are intended as examples, and the scope of the present invention is not intended to be limited thereto. The size and arrangement relationship of the members shown in each drawing may be exaggerated in order to facilitate understanding.

Embodiments

Figure 1A:
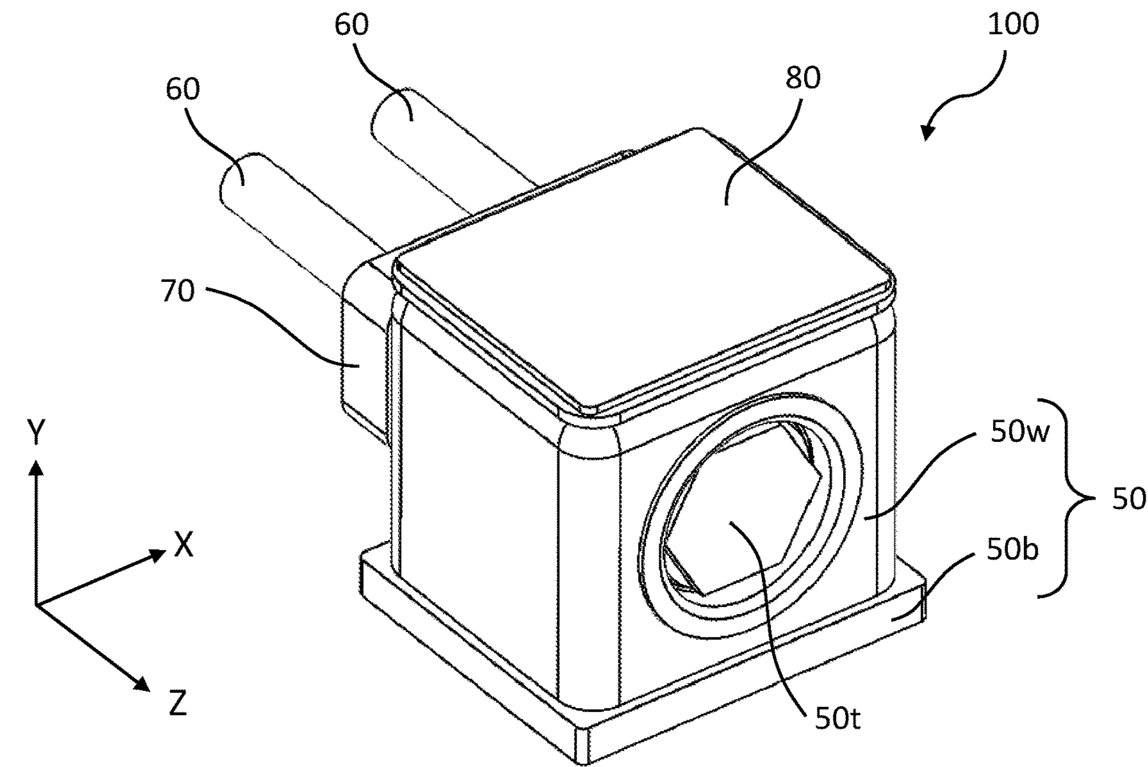
FIG. 1A is a schematic perspective view of the front side of a light emitting device according to an example embodiment of the present disclosure.
Figure 1B:
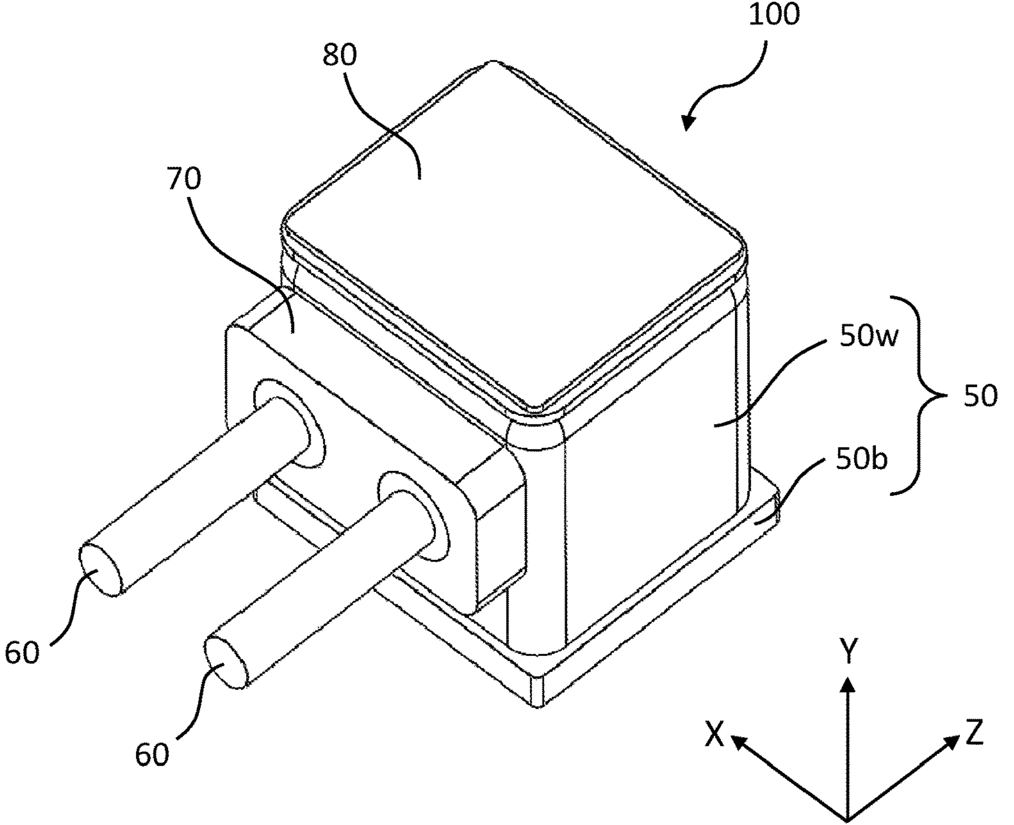
FIG. 1B is a schematic perspective view of the rear side of the light-emitting device according to the example embodiment of the present disclosure.

A basic configuration example of a light-emitting device according to an embodiment of the present disclosure is described with reference to FIG. 1A, FIG. 1B, FIG. 1C and FIG. 1D. FIG. 1A and FIG. 1B are perspective views of the front side and the rear side, respectively, schematically showing the configuration of a light-emitting device according to an example embodiment of the present disclosure. These drawings schematically show the X axis, the Y axis, and the Z axis, which are orthogonal to one another, for reference. The direction of the arrow of the X axis will be referred to as the +X direction and the opposite direction as the −X direction. Where the ±X directions are not distinguished from each other, the direction will be referred to simply as the X direction. This similarly applies to the Y direction and the Z direction. In the present specification, the +Y direction will be also denoted as "upward", and the −Y direction as "downward" for ease of understanding. This is not intended to limit the orientation in which the light-emitting device is used, and the light-emitting device can be used in any appropriate orientation.

A light-emitting device 100 shown in FIG. 1A includes a semiconductor laser element and a base 50 in which the semiconductor laser element is housed. The semiconductor laser element is not externally visible. The light-emitting device 100 further includes two lead terminals 60, via which power is supplied to the semiconductor laser element, a lead holding member 70 that holds the two lead terminals 60, and a cover 80 secured to the base 50. The cover 80 serves together with the base 50 to de an encapsulation space in which the semiconductor laser element is encapsulated. This encapsulation is preferably hermetic encapsulation. The effect of the hermetic encapsulation increases as the wavelength of the laser beam emitted from the semiconductor laser element becomes shorter. This is because, in a configuration where the semiconductor laser element is not hermetically encapsulated and the beam exit surface of the semiconductor laser element is in contact with the outside air, as the wavelength of the laser beam becomes shorter, the beam exit surface is more likely to gradually deteriorate due to dust collection while the semiconductor laser element is in operation.

The base 50 includes a bottom portion 50*b* supporting the semiconductor laser element, and a lateral wall 50*w* surrounding the semiconductor laser element. The lateral wall 50*w* is bonded to the bottom portion 50*b*. The lateral wall 50*w* includes a light-transmitting portion 50*t* that is capable of transmitting a laser beam emitted from the semiconductor laser element. The light-emitting device 100 allows the laser beam to outgo in the +Z direction from the light-transmitting portion 50*t*. The lateral wall 50*w* includes a portion elongated along the Y direction. The maximum dimension in the Y direction (height) of the lateral wall 50*w* can be, for example, equal to or greater than 0.2 times and equal to or smaller than 0.5 times the length of the outside perimeter of the lateral wall 50*w*.

Figure 1C:
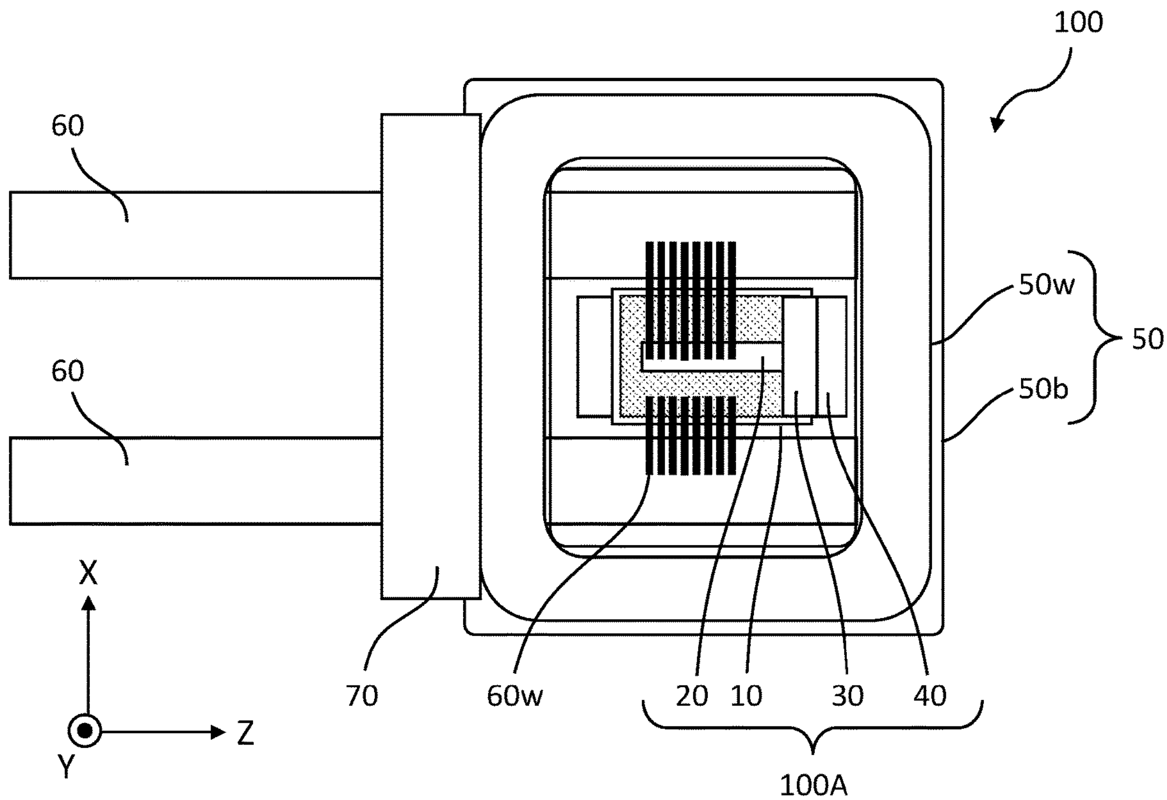
FIG. 1C is a schematic top view of the light-emitting device showing the internal structure of the light-emitting device of FIG. 1A.

FIG. 1C is a top view schematically showing the internal structure of the light-emitting device 100 of FIG. 1A. In FIG. 1C, the cover 80 is not shown. The light-emitting device 100 includes, inside the base 50, as shown in FIG. 1C, a submount 10, a semiconductor laser element 20 and a lens supporting member 30, which are supported by the submount 10, and a lens 40 supported by the lens supporting member 30. In the following description, the structure including the submount 10, the semiconductor laser element 20, the lens supporting member 30 and the lens 40 is referred to as "laser light source 100A". The laser light source 100A is a Chip on Submount type semiconductor laser light source. Details of the configuration of the laser light source 100A will be described later.

The light-emitting device 100 further includes a plurality of wires 60*w* inside the base 50. Some of the plurality of wires 60*w* are electrically coupled with one of the lead terminals 60 and the semiconductor laser element 20. The other wires 60*w* are electrically coupled with the other lead terminal 60 and the semiconductor laser element 20. The plurality of wires 60*w* are used for supplying power from the two lead terminals 60 to the semiconductor laser element 20. In the example shown in FIG. 1C, the light-emitting device 100 includes a single laser light source 100A, although the light-emitting device 100 may include two or more laser light sources 100A.

Figure 1D:
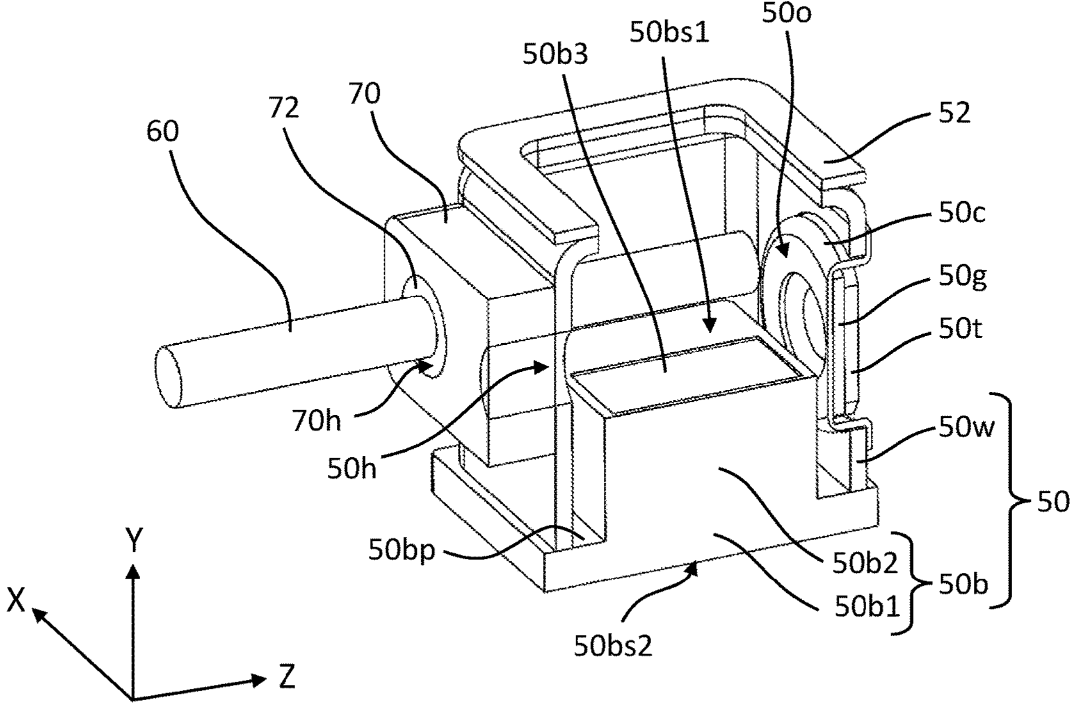
FIG. 1D is a schematic perspective view of a cross section parallel to the YZ plane, showing a base, a lead terminal and a lead holding member of the light-emitting device.

FIG. 1D is a perspective view of a cross section parallel to the YZ plane, schematically showing the base 50, the lead terminals 60 and the lead holding member 70. The lateral wall 50*w* of the base 50 has a circular opening 50*o* and a ring-shaped cap 50*c* supported by the periphery of the opening 50*o*. The cap 50*c* holds the light-transmitting portion 50*t* at its inner periphery. The periphery of the cap 50*c* and the light-transmitting portion 50*t* are joined together with a ring-shaped joining member 50*g*. The laser beam emitted from the laser light source 100A shown in FIG. 1C travels through the hollow part of the cap 50*c* and the hollow part of the joining member 50*g* before being transmitted through the light-transmitting portion 50*t*. The lateral wall 50*w* further has two through holes 50*h*, through which the two lead terminals 60 penetrate. At the upper surface of the lateral wall 50*w*, a reinforcement member 52 is provided. The reinforcement member 52 can improve the sealing performance achieved by the cover 80 shown in FIG. 1A.

The bottom portion 50*b* of the base 50 includes a flat-plate portion 50*b*1 and an elevated portion 50*b*2 that supports the laser light source 100A. The lateral wall 50*w* is bonded to the periphery 50*bp* of the flat-plate portion 50*b*1. The bottom portion 50*b* has an upper surface 50*bs*1 and a lower surface 50*bs*2. The upper surface 50*bs*1 of the bottom portion 50*b* is the upper surface of the elevated portion 50*b*2, and the lower surface 50*bs*2 of the bottom portion 50*b* is the lower surface of the flat-plate portion 50*b*1. The lower surface 50*bs*2 of the bottom portion 50*b* is also the lower surface of the base 50. The elevated portion 50*b*2 serves together with the flat-plate portion 50*b*1 to form a step. More specifically, a step is formed between the upper surface 50*bs*1 of the elevated portion 50*b*2 and the periphery 50*bp* of the flat-plate portion 50*b*1. The dimension in the Y direction of the step can be equal to or greater than 0.25 times and equal to or smaller than 0.5 times the height of the lateral wall 50*w*. Since the elevated portion 50*b*2 supports the laser light source 100A, a part of the laser light source 100A from which a laser beam is to be emitted can face the light-transmitting portion 50*t*. As a result, the laser beam emitted from the laser light source 100A outgoes via the light-transmitting portion 50*t*. In the present specification, viewing in the normal direction of the upper surface 50$bs$1 of the bottom portion 50$b$ (from the +Y direction to the −Y direction) will be referred to as "viewing from above".

The bottom portion 50$b$ is made of a plastic material, such as metals, and can be partially deformed by a press machine. The press machine can include a stage that has a flat supporting surface and a pressing portion that has a flat-surface lower end. The lower end of the pressing portion can be adjusted so as to be parallel to the supporting surface of the stage. On the stage of the thus-configured press machine, the base 50 is placed such that the bottom portion 50$b$ is located downside. Then, a predetermined region of the upper surface 50$bs$1 of the bottom portion 50$b$ is pressed down by the pressing portion inserted through the gap between the two lead terminals 60, whereby a recessed portion 50$b$3 is formed in the upper surface 50$bs$1 of the bottom portion 50$b$.

In a configuration before the recessed portion 50$b$3 is formed, in bonding the lateral wall 50$w$ to the bottom portion 50$b$, a part of the bottom portion 50$b$ bonded to the lateral wall 50$w$ is pulled by the lateral wall 50$w$, and the bottom portion 50$b$ is accordingly deformed, so that the lower surface 50$bs$2 can be a downward convex surface. Even if such deformation does not occur, the upper surface 50$bs$1 and the lower surface 50$bs$2 of the bottom portion 50$b$ may not be parallel to each other due to manufacturing errors in the bottom portion 50$b$. Therefore, if the laser light source 100A is placed on the upper surface 50$bs$1 of the bottom portion 50$b$ which does not have the recessed portion 50$b$3, the optical axis of the laser beam emitted from the laser light source 100A will disadvantageously deviate from the designed optical axis. In the present specification, the phrase "the optical axis of the laser beam deviates from the designed optical axis" means that the direction of the optical axis of the laser beam is not parallel to the direction of the designed optical axis.

In contrast, in the light-emitting device 100 of the present embodiment, the upper surface 50$bs$1 of the bottom portion 50$b$ has the recessed portion 50$b$3 formed by the press machine at a position between the two lead terminals 60 as viewed from above. The recessed portion 50$b$3 has a flat bottom surface on which the laser light source 100A is placed. Further, in forming the recessed portion 50$b$3 in the upper surface 50$bs$1 of the bottom portion 50$b$ by the press machine, the lower surface 50$bs$2 of the bottom portion 50$b$ is deformed into a flat surface. The bottom surface of the recessed portion 50$b$3 is parallel to the lower surface 50$bs$2 of the bottom portion 50$b$. The flatness of each of the bottom surface of the recessed portion 50$b$3 and the lower surface 50$bs$2 of the bottom portion 50$b$ can be, for example, equal to or smaller than 1 mm.

The flatness is defined according to, for example, JIS 0621-1984 as the magnitude of deviation from the geometrically correct plane of a planform ("geometric plane"). In a case where an object is interposed between two geometric planes that are strictly parallel to each other, the dimension of the gap between the two geometric planes is referred to as flatness. The flatness can be measured by, for example, a three-dimensional measurement device. In the present specification, the phrase "two planes are parallel to each other" includes not only a case where the two planes are strictly parallel to each other but also a case where the absolute value of the angle between the two planes is equal to or smaller than 0.5°.

Now, consider an example where the light-emitting device 100 is mounted to a mounting surface that is parallel to the XZ plane, and the front surface of the light-emitting device 100 faces in the +Z direction. In this configuration, the lower surface 50$bs$2 of the bottom portion 50$b$ is parallel to the mounting surface, and the laser light source 100A is placed on the bottom surface of the recessed portion 50$b$3. In such a configuration, the bottom surface of the recessed portion 50$b$3 is parallel to the lower surface 50$bs$2 of the bottom portion 50$b$ and, therefore, the direction of the optical axis of the laser beam emitted from the laser light source 100A can be parallel to the +Z direction, which is the direction of the designed optical axis. Thus, according to the light-emitting device 100 of the present embodiment, deviation of the optical axis of an outgoing laser beam can be suppressed. In the present specification, the phrase "the direction of the optical axis of the laser beam is parallel to the direction of the designed optical axis" includes not only a case where the directions are strictly parallel to each other, i.e., the directions are strictly identical directions, but also a case where the absolute value of the angle between the directions is equal to or smaller than 0.5°.

The arrangement of the two lead terminals 60 and the lead holding member 70 is as follows. The two lead terminals 60 are arranged so as to penetrate through the lateral wall 50$w$. One end of each of the lead terminals 60 is located inside the encapsulation space. The lead holding member 70 is provided on the rear surface of the base 50 and holds the two lead terminals 60. The lead holding member 70 has two through holes 70$h$, through which the two lead terminals 60 respectively penetrate, and two joining members 72 that respectively fill the gaps in the through holes 70$h$ between the lead holding member 70 and the lead terminals 60. The lead holding member 70 contributes to maintain the encapsulation space even when the lateral wall 50$w$ thermally expands while the light-emitting device 100 is in operation. So long as the thermal expansion does not matter, the two through holes 50$h$ of the lateral wall 50$w$ may hold the two lead terminals 60 without using the lead holding member 70.

Figure 2A:
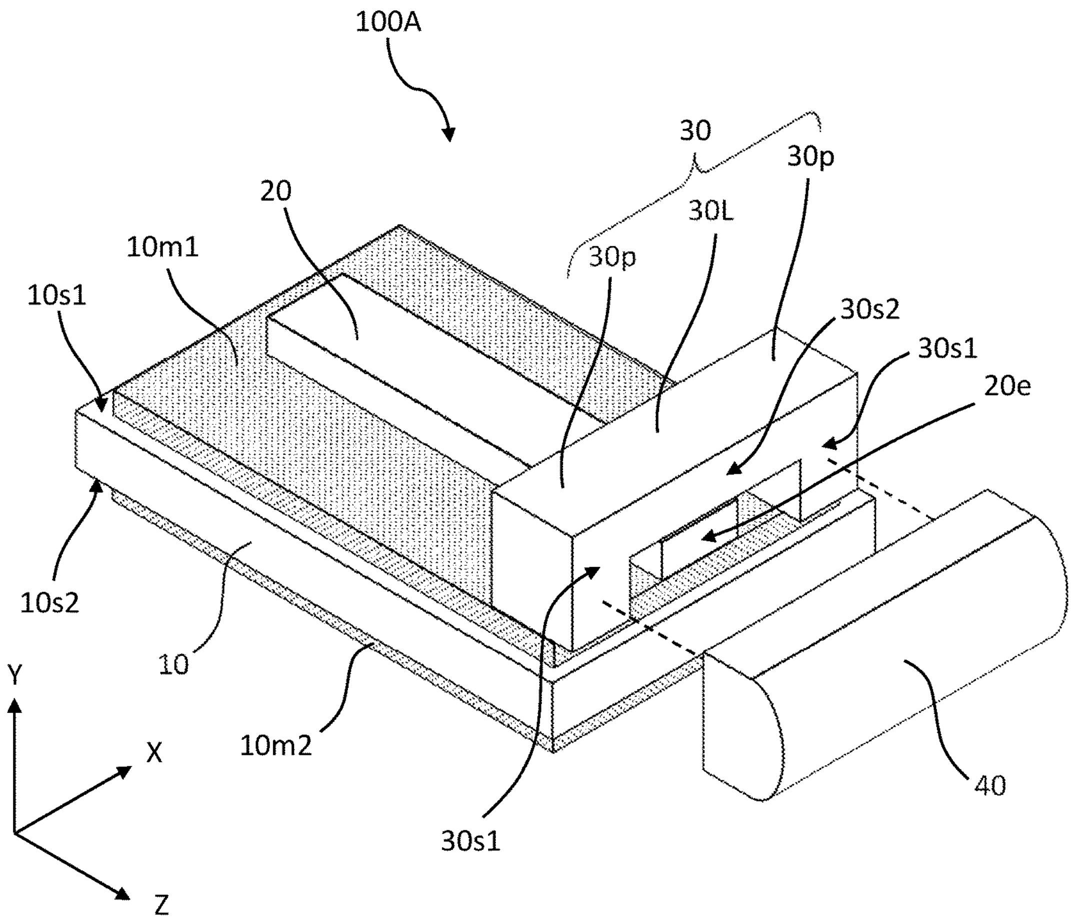
FIG. 2A is an exploded schematic perspective view showing the configuration of a laser light source of the light-emitting device.
Figure 2B:
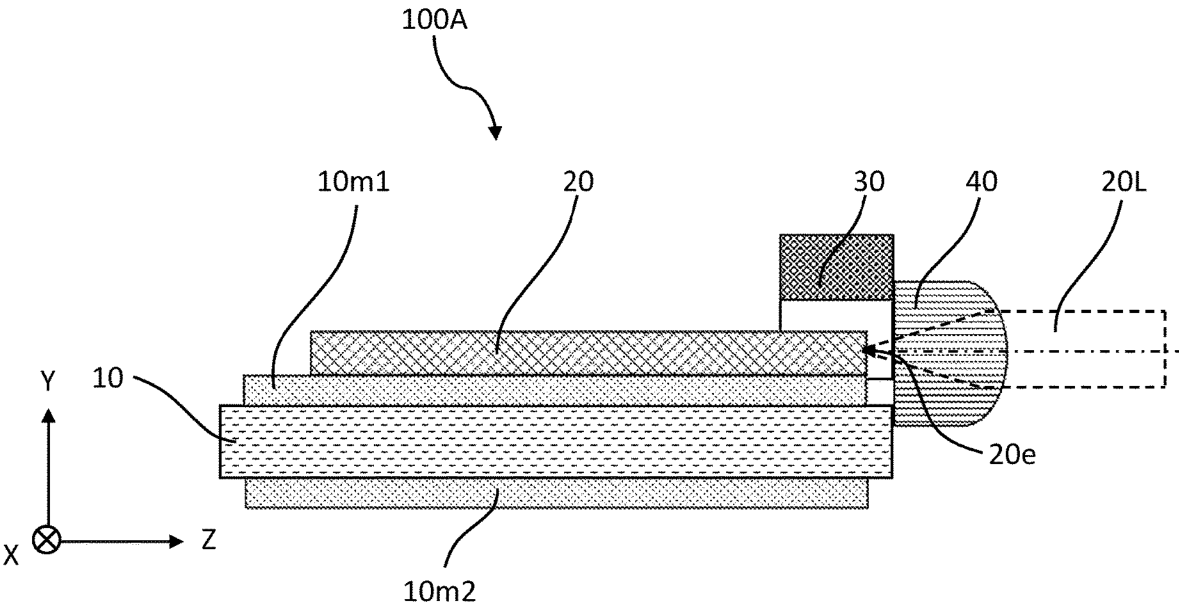
FIG. 2B is a schematic cross-sectional view of the laser light source shown in FIG. 2A taken along a plane parallel to the YZ plane.

Hereinafter, the configuration of the laser light source 100A housed in the light-emitting device 100 shown in FIG. 1C is described with reference to FIG. 2A and FIG. 2B. FIG. 2A is an exploded perspective view schematically showing the configuration of the laser light source 100A. The laser light source 100A shown in FIG. 2A includes a submount 10, an end-emitting semiconductor laser element 20, a lens supporting member 30, and a lens 40. In FIG. 2A, the lens supporting member 30 and the lens 40 are shown as being separated from each other, although in actuality they are bonded together. FIG. 2B is a cross-sectional view of the laser light source 100A shown in FIG. 2A, which is parallel to the YZ plane.

The submount 10 has an upper surface 10$s$1 and a lower surface 10$s$2, which are parallel to the XZ plane, as shown in FIG. 2A. The upper surface 10$s$1 of the submount 10 is provided with a first metal film 10$m$1, and the lower surface 10$s$2 is provided with a second metal film 10$m$2. In bonding the semiconductor laser element 20 and the lens supporting member 30 to the upper surface 10$s$1 of the submount 10 using an inorganic bonding material, the first metal film 10$m$1 improves the bonding strength. The inorganic bonding material can be, for example, a solder material such as gold tin, or a sintered material such as a metal paste containing a plurality of metal particles and an organic binder. The first metal film 10$m$1, which is electrically conductive, can also be used for supplying power to the semiconductor laser element 20. Further, the first metal film 10$m$1 can improve the heat conductivity and therefore contributes to radiation of the heat while the semiconductor laser element 20 is in operation. In bonding the laser light source 100A to the bottom surface of the recessed portion 50$b$3 shown in FIG.

1D using an inorganic bonding material, the second metal film 10$m$2 improves the bonding strength. The inorganic bonding material can be, for example, the above-described solder material or sintered material.

The semiconductor laser element 20 is supported by the upper surface 10$s$1 of the submount 10 with the first metal film 10$m$1 interposed therebetween as shown in FIG. 2A. The semiconductor laser element 20 has an emission surface 20$e$ at one of the two end surfaces, which intersect the Z direction, and is capable of emitting a laser beam in the Z direction from the emission surface 20$e$. While advancing in the +Z direction, the laser beam diverges at different speeds in the YZ plane and the XZ plane. The laser beam diverges relatively fast in the YZ plane but relatively slow in the XZ plane. The spot of the laser beam, when not collimated, has an elliptical shape in the far field, with the major axis in the Y direction and the minor axis in the X direction in the XY plane.

The lens supporting member 30 is supported by the upper surface 10$s$1 of the submount 10 with the first metal film 10$m$1 interposed therebetween as shown in FIG. 2A. The lens supporting member 30 includes two pillar portions 30$p$ and a bridge portion 30L extending between the two pillar portions 30$p$ and connecting the two pillar portions 30$p$. The two pillar portions 30$p$ are located on opposite sides of the semiconductor laser element 20, and the bridge portion 30L is located above the semiconductor laser element 20. The lens supporting member 30 supports the lens 40 at end surfaces 30$s$1 of the two pillar portions 30$p$. The lens supporting member 30 is located so as to extend astride the semiconductor laser element 20 and does not block entry of the laser beam emitted from the semiconductor laser element 20 into the lens 40.

The lower surface of the semiconductor laser element 20 is present at the same or higher level in the Y direction as/than the lower surfaces of the two pillar portions 30$p$. The upper surface of the semiconductor laser element 20 is present at a lower level in the Y direction than the upper surfaces of the two pillar portions 30$p$ and is present at a lower level in the Y direction than the lower surface of the bridge portion 30L. As viewed from the +Z direction side, the emission surface 20$e$ of the semiconductor laser element 20 is present at a higher level in the Y direction than the lower sides of the end surfaces 30$s$1 of the two pillar portions 30$p$, is present at a lower level in the Y direction than the upper sides of the end surfaces 30$s$1, and is present at a lower level in the Y direction than the end surface 30$s$2 of the bridge portion 30L.

The lens 40 is a cylindrical lens elongated along the X direction as shown in FIG. 2A. The lens 40 has a flat surface on the light entry side and a convex surface on the light exit side. The convex surface has curvature in the YZ plane. The focal point of the lens 40 coincides with the center of the emission point of the emission surface 20$e$ of the semiconductor laser element 20. The phrase "the focal point of the lens 40 coincides with the center of the emission surface 20$e$" includes not only a case where the focal point of the lens 40 strictly coincides with the center of the emission surface 20$e$ but also a case where the difference between the focal point of the lens 40 and the center of the emission surface 20$e$ is equal to or smaller than 1 μm. As shown in FIG. 2B, the lens 40 collimates, in the YZ plane, a laser beam 20L emitted in the +Z direction from the emission surface 20$e$ of the semiconductor laser element 20. In the region enclosed by the dashed line shown in FIG. 2B, the intensity of the laser beam 20L is equal to or greater than $1/e^2$ times the peak intensity of the laser beam 20L. e is the base of the natural logarithm.

The lens 40 is located inside the encapsulation space and therefore can collimate the laser beam 20L before the laser beam 20L widely diverges. Thus, the lens 40 can have a small size. In the example shown in FIG. 2B, the direction of the optical axis (dotted dashed line) of the laser beam 20L is parallel to the +Z direction, which is the direction of the designed optical axis. In the present specification, the collimating includes not only reshaping the laser beam 20L into parallel light but also reducing the divergence of the laser beam 20L.

The convex surface on the light exit side of the lens 40 may have curvature not only in the YZ plane but also in the XZ plane. When having such a convex surface, the lens 40 collimates the laser beam 20L not only in the YZ plane but also in the XZ plane. So long as a part of the surface on the light exit side of the lens 40 from which the laser beam 20L outgoes has curvature, the lens 40 may or may not have curvature in the other parts. The lens 40 may be a condenser lens that is capable of converging the laser beam.

At least part of the end surfaces 30$s$1 of the two pillar portions 30$p$ of the lens supporting member 30 and a surface of the lens 40 facing on the at least part of the end surfaces 30$s$1 are bonded together with an inorganic bonding material. The at least part of the end surfaces 30$s$1 of the lens supporting member 30 is provided with a metal film while the surface of the lens 40 facing on the at least part of the end surfaces 30$s$1 is also provided with a metal film, whereby the bonding strength between the lens supporting member 30 and the lens 40 can be improved. If the inorganic bonding material is a metal paste, in bonding the lens 40 to the lens supporting member 30, the lens 40 can be repositioned such that the lens 40 can collimate the laser beam 20L.

The center of mass of the lens 40 is present between the end surfaces 30$s$1 of the two pillar portions 30$p$ in the X direction as viewed from the +Z direction side. The center of mass of the lens 40 is present at a position equal to or higher than the lower side of the end surfaces 30$s$1 of the two pillar portions 30$p$ and lower than the upper side of the end surfaces 30$s$1 in the Y direction as viewed from the +Z direction side. When the center of mass of the lens 40 is at such a position, the lens 40 can be stably secured to the lens supporting member 30.

Figure 3A:
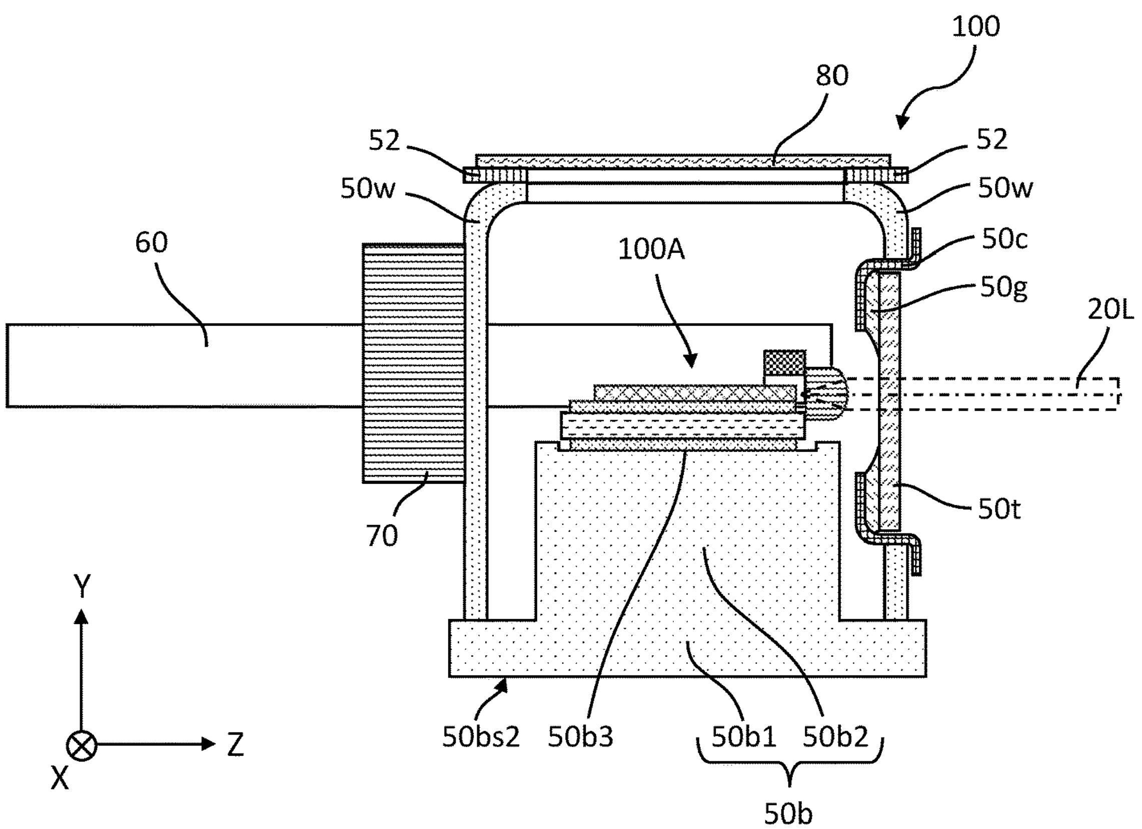
FIG. 3A is a schematic cross-sectional view of the light-emitting device shown in FIG. 1A, taken along a plane parallel to the YZ plane.
Figure 3B:
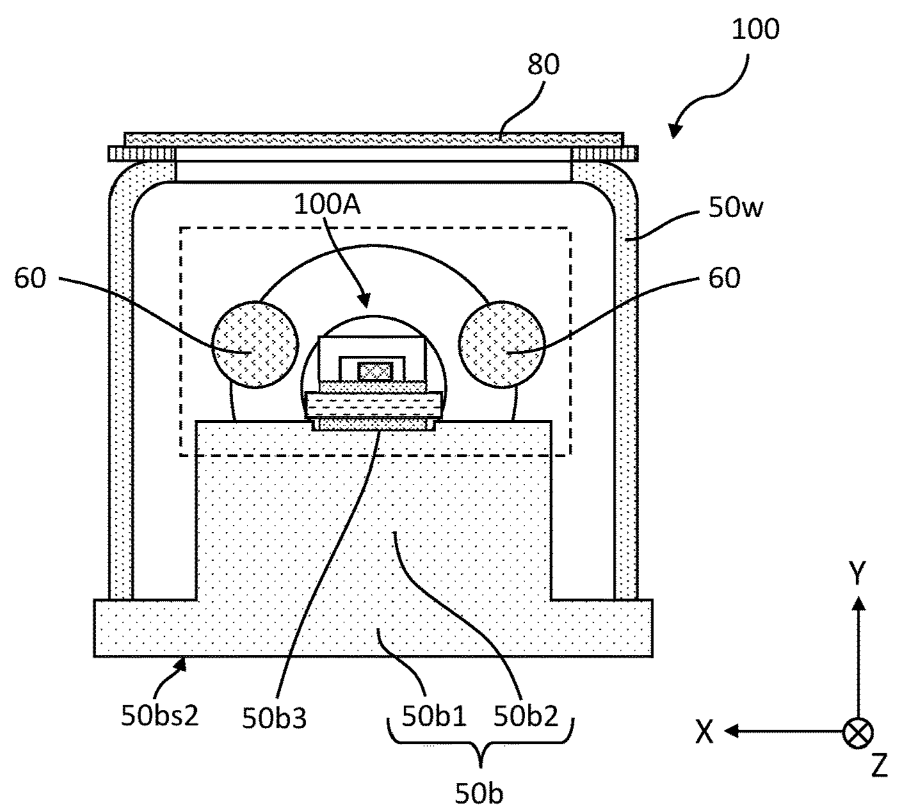
FIG. 3B is a schematic cross-sectional view of the light-emitting device shown in FIG. 1A, taken along a plane parallel to the XY plane.
Figure 3C:
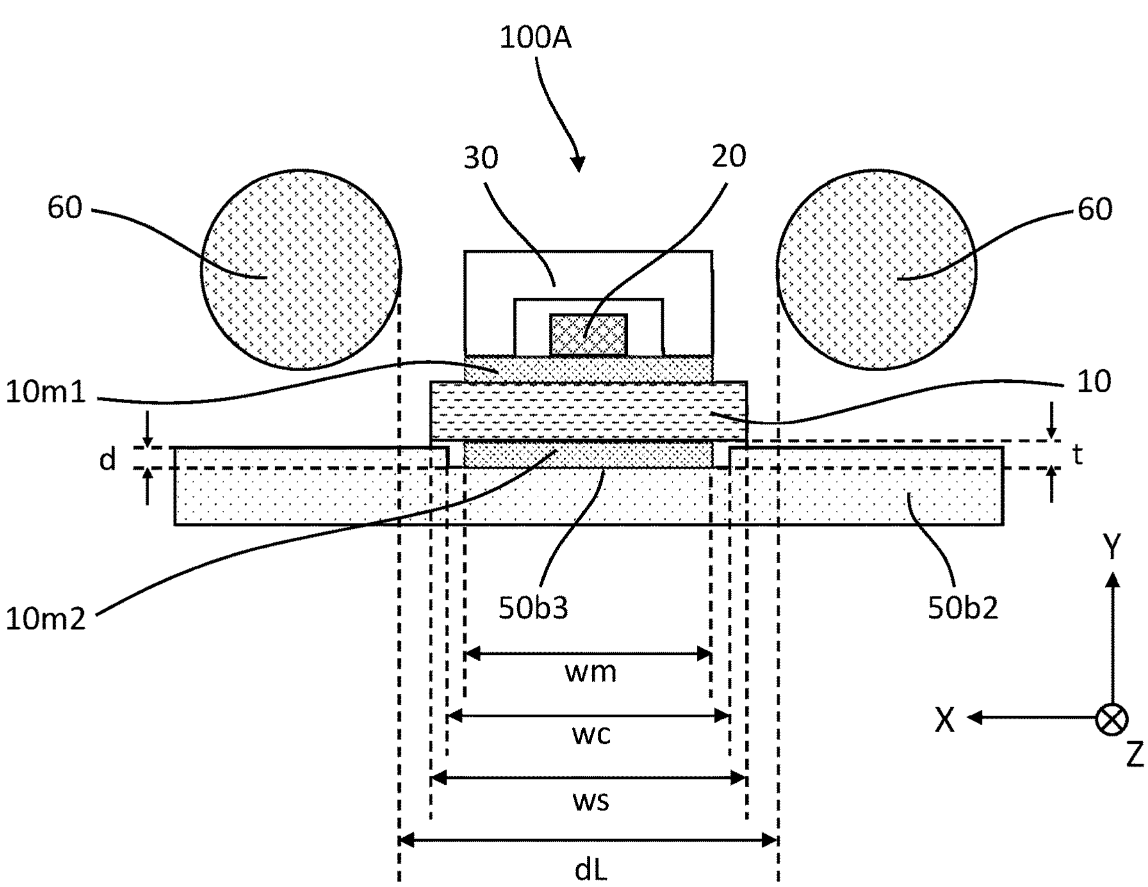
FIG. 3C is an enlarged view of a region enclosed by the dashed line shown in FIG. 3B.

Next, the arrangement of the laser light source 100A shown in FIG. 2A on the bottom portion 50$b$ is described with reference to FIG. 3A, FIG. 3B and FIG. 3C. FIG. 3A and FIG. 3B are cross-sectional views of the light-emitting device 100 shown in FIG. 1A, which are parallel to the YZ plane and the XY plane, respectively. FIG. 3C is an enlarged view of a region enclosed by the dashed line shown in FIG. 3B.

As shown in FIG. 3A and FIG. 3B, the laser light source 100A is provided at the bottom surface of the recessed portion 50$b$3. Specifically, the second metal film 10$m$2 provided on the submount 10 shown in FIG. 2A and the bottom surface of the recessed portion 50$b$3 are bonded to each other with an inorganic bonding material. The inorganic bonding material can be, for example, a solder material or a sintered material. As previously described, according to the light-emitting device 100 of the present embodiment, as shown in FIG. 3A, the direction of the optical axis of the laser beam 20L emitted from the laser light source 100A and outgoing via the light-transmitting portion 50$t$ can be parallel to the +Z direction, which is the direction of the designed optical axis.

As shown in FIG. 3C, the dimension in the X direction (width wm) of the second metal film 10*m*2 is equal to or smaller than the dimension in the X direction (width wc) of the recessed portion 50*b*3, and the dimension in the Y direction (thickness t) of the second metal film 10*m*2 is greater than the dimension in the Y direction (depth d) of the recessed portion 50*b*3. Therefore, when the laser light source 100A is provided on the bottom surface of the recessed portion 50*b*3, the elevated portion 50*b*2 is not in contact with the submount 10. The depth d of the recessed portion 50*b*3 can be, for example, equal to or greater than 0.01 times and equal to or smaller than 0.1 times the dimension in the Y direction of the elevated portion 50*b*2.

The dimension in the X direction (width ws) of the submount 10 is greater than the width wc of the recessed portion 50*b*3. Since the submount 10 is not in contact with the elevated portion 50*b*2, it is not necessary to reduce the width ws of the submount 10 in consideration of the width wc of the recessed portion 50*b*3. Therefore, the heat produced in the semiconductor laser element 20 can be efficiently transferred to the elevated portion 50*b*2 via the submount 10 as compared with a case where the width ws of the submount 10 is smaller than the width wc of the recessed portion 50*b*3.

Meanwhile, the width ws of the submount 10 is smaller than the dimension dL of the gap between the two lead terminals 60. Therefore, the laser light source 100A can be passed through the gap between the two lead terminals 60 and placed on the elevated portion 50*b*2. The separation direction in which the two lead terminals 60 are separated is parallel to the X direction.

Next, an example of the method for producing a package of the light-emitting device 100 according to the present embodiment is described with reference to FIG. 4A, FIG. 4B and FIG. 4C. In the present specification, the structure for encapsulating the laser light source 100A shown in FIG. 2A is referred to as "package". In the example shown in FIG. 1A, FIG. 1B, FIG. 1C and FIG. 1D, the package includes the base 50, the two lead terminals 60, the lead holding member 70 and the cover 80. Part of the package exclusive of the cover 80 is also referred to as "package main body".

Figure 4A:
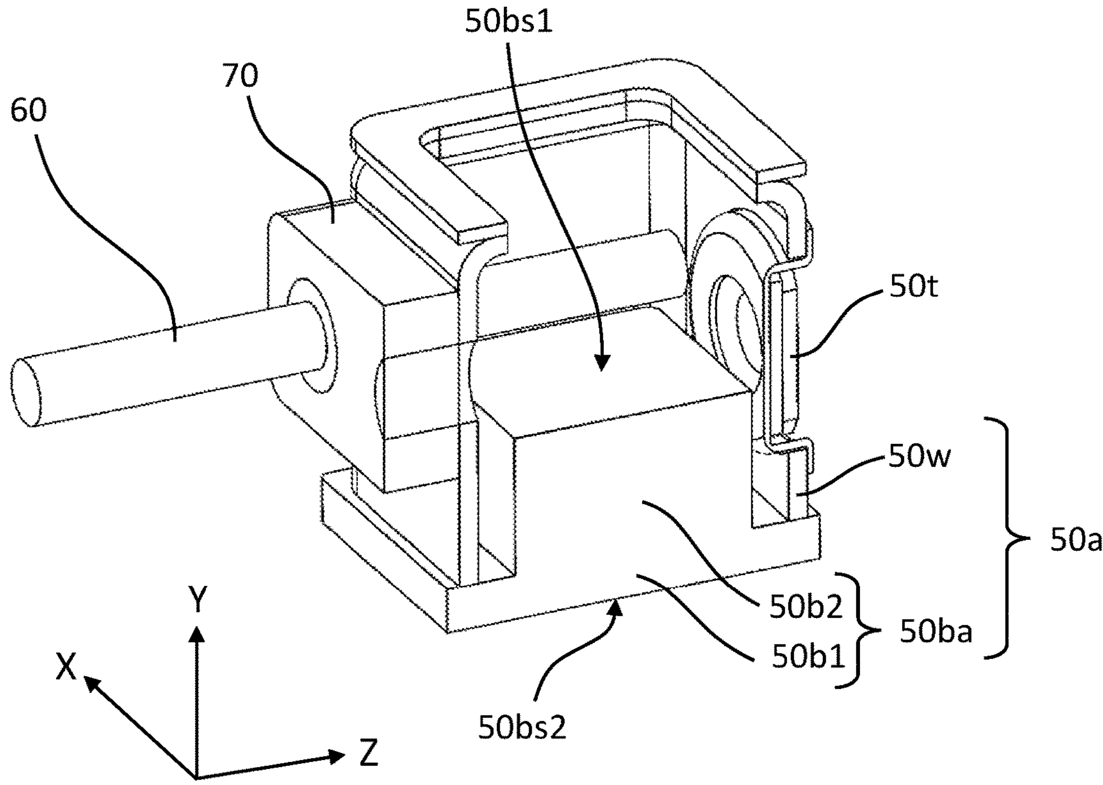
FIG. 4A is a diagram for illustrating an example of a step in a method for producing a package of a light-emitting device according to the present embodiment.
Figure 4B:
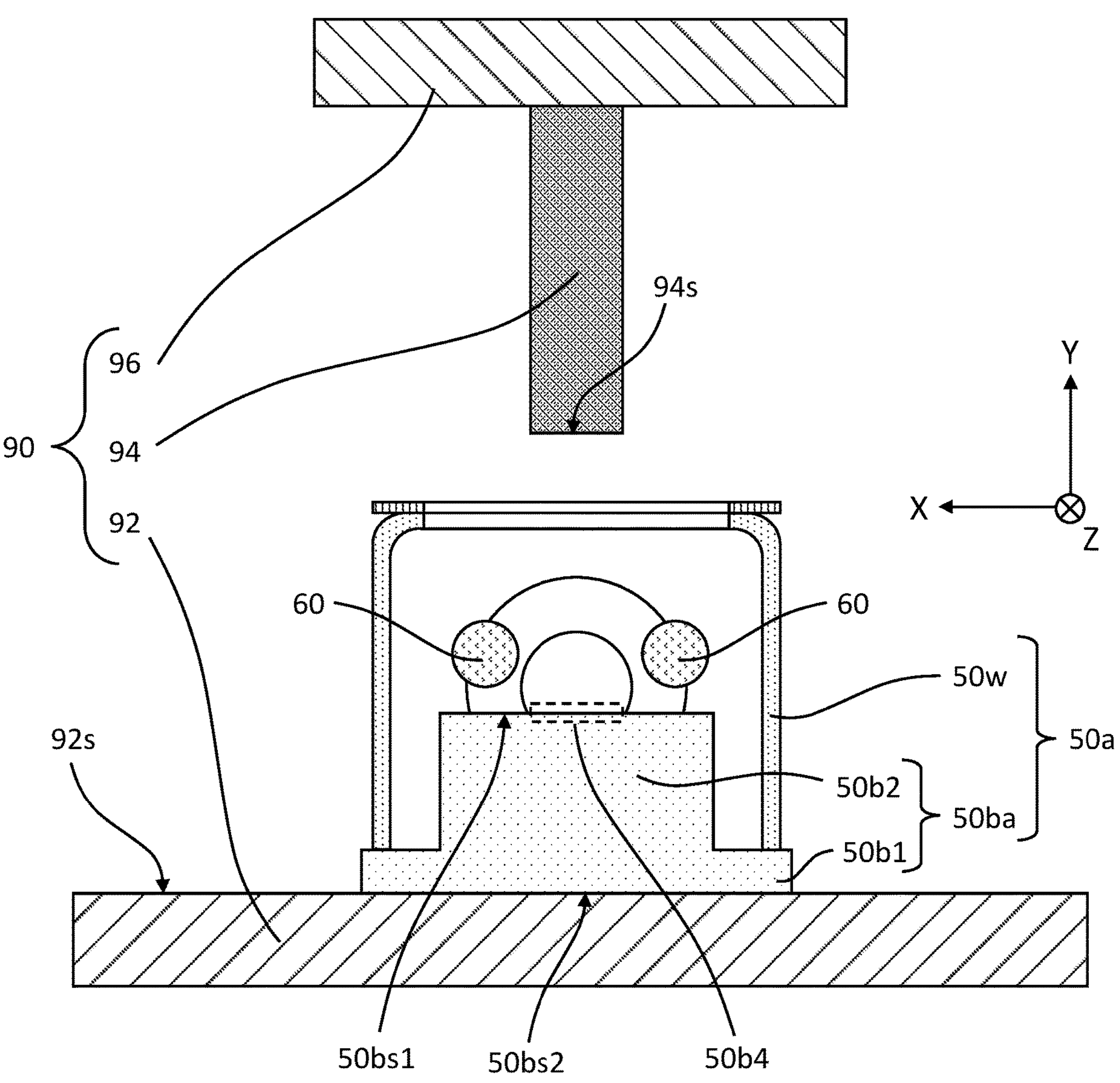
FIG. 4B is a diagram for illustrating an example of a step in the method for producing a package of a light-emitting device according to the present embodiment.
Figure 4C:
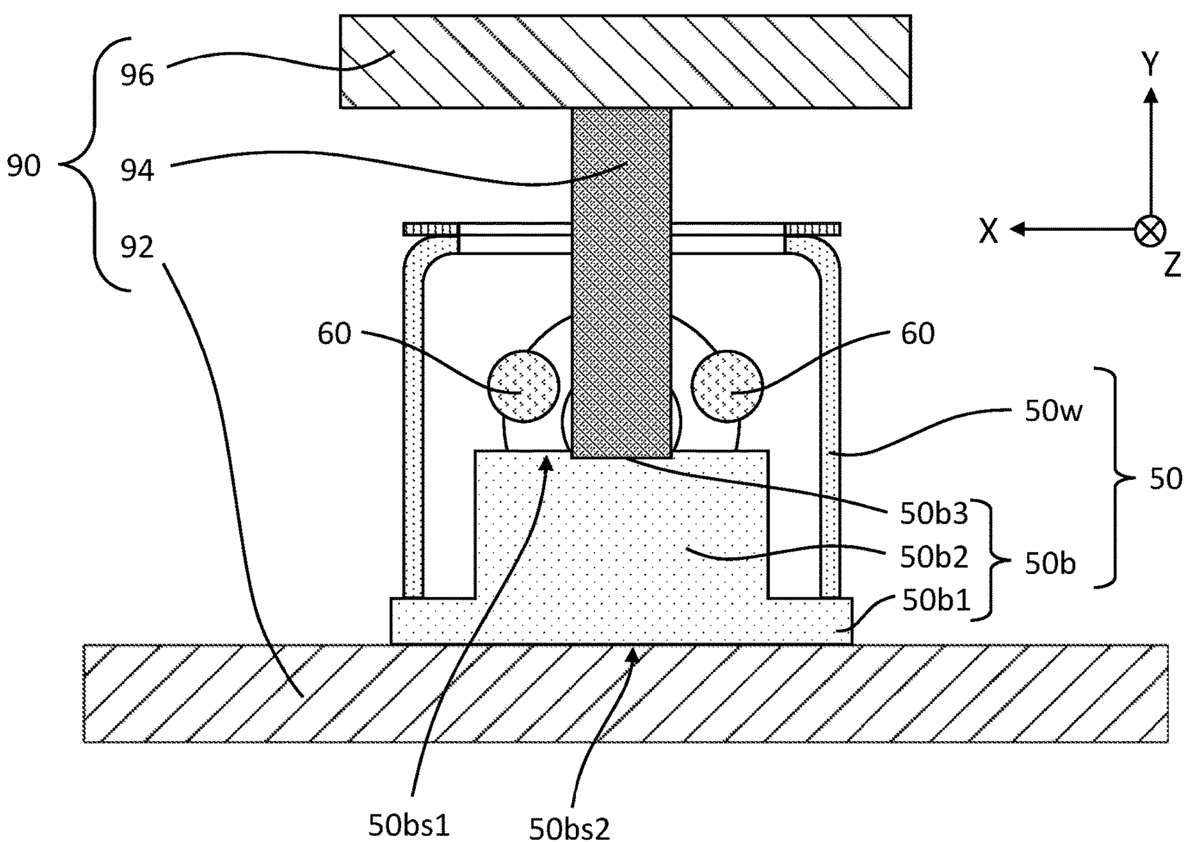
FIG. 4C is a diagram for illustrating an example of a step in the method for producing a package of a light-emitting device according to the present embodiment.

FIG. 4A, FIG. 4B and FIG. 4C are diagrams for illustrating an example of steps in the method for producing the package of the light-emitting device 100 according to the present embodiment. In the first step, as shown in FIG. 4A, a package main body is provided. The package main body includes a base 50*a* that includes a bottom portion 50*ba* and the lateral wall 50*w*, two lead terminals 60, and a lead holding member 70. FIG. 4A is a perspective view showing a cross section of the package main body, which is parallel to the YZ plane. The bottom portion 50*ba* and the lateral wall 50*w* form a space for housing the laser light source 100A shown in FIG. 2A. The bottom portion 50*ba* includes the flat-plate portion 50*b*1 and the elevated portion 50*b*2 but does not have a recessed portion. In the bottom portion 50*ba*, as previously described, in bonding the lateral wall 50*w* to the bottom portion 50*ba*, the bottom portion 50*ba* may be deformed so that the lower surface 50*bs*2 results in a downward convex surface, or the upper surface 50*bs*1 and the lower surface 50*bs*2 of the bottom portion 50*ba* may not be parallel to each other due to production errors.

In the next step, the package shown in FIG. 4A is placed in the press machine 90 as shown in FIG. 4B. FIG. 4B shows a cross section of the package main body and the press machine 90, which is parallel to the XY plane. The press machine 90 includes a stage 92 that has an upper surface 92*s*, a pressing portion 94 elongated along the Y direction, which has a lower end 94*s*, and a supporting member 96 that supports the pressing portion 94 and that is movable along the Y direction. The upper surface 92*s* of the stage 92 and the lower end 94*s* of the pressing portion 94 are flat surfaces and are parallel to each other. The upper surface 92*s* of the stage 92 and the lower end 94*s* of the pressing portion 94 are parallel to the XZ plane. In the package main body, the lower surface 50*bs*2 of the bottom portion 50*ba* is supported by the upper surface 92*s* of the stage 92. In a predetermined region 50*b*4 of the upper surface 50*bs*1 of the bottom portion 50*ba* which is present between the two lead terminals 60 as viewed from above, a recessed portion is formed.

In the next step, as shown in FIG. 4C, the press machine 90 presses down the predetermined region 50*b*4 shown in FIG. 4B by the lower end 94*s* of the pressing portion 94 inserted through the gap between the two lead terminals 60, thereby forming the recessed portion 50*b*3 in the upper surface 50*bs*1 of the bottom portion 50*b*. The press machine 90 flattens the lower surface 50*bs*2 of the bottom portion 50*b* and the bottom surface of the recessed portion 50*b*3 and makes these surfaces parallel to each other.

Through the above steps, the package of the light-emitting device 100 according to the present embodiment can be produced. By the simple step of forming the recessed portion 50*b*3 in the upper surface 50*bs*1 of the bottom portion 50*b* using the press machine 90, the deviation of the optical axis of the laser beam outgoing from the light-emitting device 100 can be suppressed as previously described.

The method for producing the light-emitting device 100 according to the present embodiment includes placing the laser light source 100A shown in FIG. 2A on the bottom surface of the recessed portion 50*b*3 in addition to the above-described package production process. In the light-emitting device 100, the semiconductor laser element 20 is provided on the bottom surface of the recessed portion 50*b*3 with the submount 10, the first metal film 10*m*1, and the second metal film 10*m*2 being interposed therebetween.

Next, an example of the light-emitting device 100 according to the present embodiment and a comparative example (hereinafter, respectively referred to as "Example 1" and "Comparative Example") are described with reference to FIG. 5A and FIG. 5B and TABLE 1. The light-emitting device of Example 1 has a configuration where a laser light source is housed in the package shown in FIG. 1D. On the other hand, the light-emitting device of Comparative Example has a configuration where a laser light source is housed in the package shown in FIG. 4A. In each of Example 1 and Comparative Example, the deviation angle $\Delta\theta 1$ between the optical axis of a laser beam emitted from the laser light source before being housed and the designed optical axis was examined. Further, in each of Example 1 and Comparative Example, the deviation angle $\Delta\theta 2$ between the optical axis of a laser beam outgoing from the light-emitting device in which a laser light source has been housed and the designed optical axis was examined.

Figure 5A:
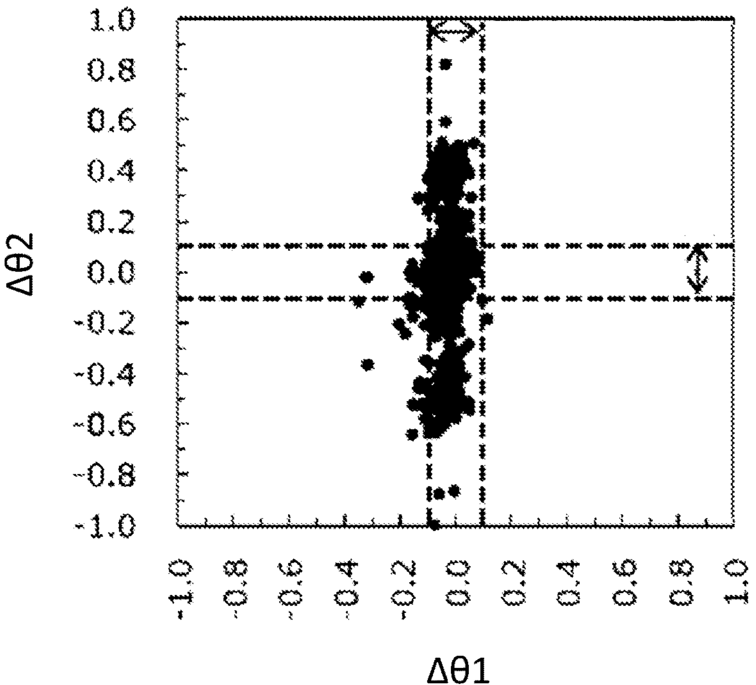
FIG. 5A is a graph for Comparative Example, showing the relationship between the deviation angle of the optical axis of a laser beam emitted from a laser light source before being housed in a light-emitting device (horizontal axis) and the deviation angle of the optical axis of a laser beam outgoing from the light-emitting device in which the laser light source has been housed (vertical axis).
Figure 5B:
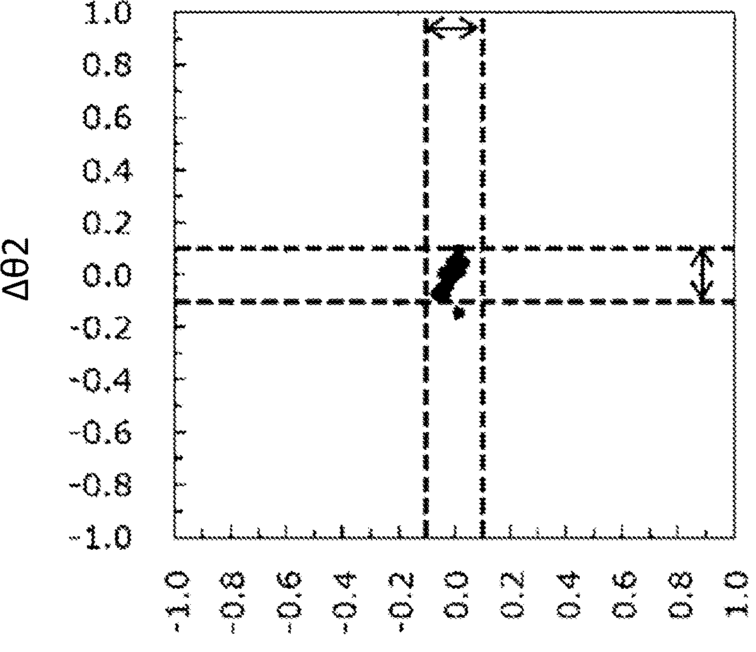
FIG. 5B is a graph for Example 1, showing the relationship between the deviation angle of the optical axis of a laser beam emitted from a laser light source before being housed in a light-emitting device (horizontal axis) and the deviation angle of the optical axis of a laser beam outgoing from the light-emitting device in which the laser light source has been housed (vertical axis).

FIG. 5A and FIG. 5B are graphs for Comparative Example and Example 1, respectively, showing the relationship between the deviation angle $\Delta\theta 1$ of the optical axis of a laser beam emitted from a laser light source before being housed and the deviation angle $\Delta\theta 2$ of the optical axis of a laser beam outgoing from the light-emitting device in which the laser light source has been housed. Positive and negative values of the deviation angles $\Delta\theta 1$ and $\Delta\theta 2$ respectively represent upside and downside deviations of the optical axis of the laser beam from the designed optical axis. The region enclosed by the dashed lines shown in FIG. 5A and FIG. 5B represents an example of the tolerance of the deviation angles Δθ1, Δθ2. The tolerance is equal to or greater than −0.1° and equal to or smaller than 0.1°. The number of samples of Comparative Example shown in FIG. 5A was 648, and the number of samples of Example 1 shown in FIG. 5B was 31.

In Comparative Example shown in FIG. 5A, the proportion of samples whose deviation angle Δθ1 was within the tolerance was high, while the proportion of samples whose deviation angle Δθ2 was within the tolerance was considerably low. In contrast, in Example 1 shown in FIG. 5B, the proportion of samples whose deviation angle Δθ1 was within the tolerance was 100%, while the proportion of samples whose deviation angle Δθ2 was within the tolerance was also extremely high.

TABLE 1 shows, for Comparative Example and Example 1, the number of samples of the laser light source and the light-emitting device, the standard deviation, maximum and minimum of the deviation angle of a laser beam emitted from the laser light source and the light-emitting device, and the yield of the laser light source and the light-emitting device, which are all illustrative. The yield was calculated using the above-described tolerance.

TABLE 1

| | Comparative Example LASER LIGHT SOURCE | Comparative Example LIGHT-EMITTING DEVICE | Example 1 LASER LIGHT SOURCE | Example 1 LIGHT-EMITTING DEVICE |
|---|---|---|---|---|
| NUMBER OF SAMPLES | 648 | 648 | 31 | 31 |
| STANDARD DEVIATION OF DEVIATION ANGLE (°) | 0.046 | 0.263 | 0.024 | 0.051 |
| MAXIMUM DEVIATION ANGLE (°) | 0.113 | 0.823 | 0.033 | 0.095 |
| MINIMUM DEVIATION ANGLE (°) | −0.346 | −0.997 | −0.066 | −0.145 |
| RANGE OF DEVIATION ANGLE (°) | 0.459 | 1.820 | 0.099 | 0.240 |
| YIELD (%) | 93.4 | 48.8 | 100.0 | 96.8 |

According to Comparative Example, as seen from TABLE 1, the standard deviation of the deviation angle of a laser beam outgoing from the light-emitting device in which the laser light source had been housed was 5.72 times, the maximum of the deviation angle was 7.28 times, and the minimum of the deviation angle was 2.88 times as compared with the laser light source before being housed. The yield of the laser light source before being housed was 93.4%, while the yield of the light-emitting device in which the laser light source had been housed was 48.8%, which was considerably low.

In contrast, according to Example 1, as seen from TABLE 1, the standard deviation of the deviation angle of a laser beam outgoing from the light-emitting device in which the laser light source had been housed was 2.13 times, the maximum of the deviation angle was 2.88 times, and the minimum of the deviation angle was 2.20 times as compared with the laser light source before being housed. In Example 1, the deviation of the optical axis did not deteriorate as much as in Comparative Example. As a result, the yield of the laser light source before being housed was 100%, and the yield of the light-emitting device in which the laser light source had been housed remained high at 96.8%.

From the foregoing, it was confirmed that, according to the light-emitting device 100 of the present embodiment, the deviation of the optical axis of the outgoing laser beam can be effectively suppressed.

Further, in the light-emitting device 100 according to the present embodiment, as will be described later, the lead terminals 60 are capable of allowing a large electric current to flow therethrough, and the lead holding member 70 can improve the durability of the package against the thermal stress. Therefore, the light-emitting device 100 according to the present embodiment is capable of emitting a high-power laser beam of, for example, 10 W or more.

The light-emitting device 100 according to the present embodiment, which is capable of suppressing the deviation of the optical axis of the laser beam and emitting a high-power laser beam, can be used in, for example, a laser processing machine for metalworking. The laser processing machine includes a plurality of light-emitting devices 100 aligned along one direction on a heat sink and a condenser lens that is capable of converging the laser beams emitted from the plurality of light-emitting devices 100. Since the deviation of the optical axis of the laser beam emitted from each of the light-emitting devices 100 is small, the high-power laser beams emitted from the plurality of light-emitting devices 100 can be converged with high accuracy by the condenser lens.

If the laser beam emitted from each of the light-emitting devices 100 has a short wavelength, it is possible to efficiently process metals using the above-described converged laser beam because the absorption of light at short wavelengths by metals is high. When the metal is copper, the wavelength of the laser beam emitted from each of the light-emitting devices 100 can be, for example, equal to or higher than 420 nm and equal to or lower than 450 nm, and the power of the laser beam can be, for example, equal to or greater than 10 W. The light-emitting device 100 according to the present embodiment may be used not only in laser processing machines but also in projectors or light sources for lighting devices, for example.

Hereinafter, the details, e.g., shape, material and dimensions, of the constituents of the light-emitting device 100 according to the present embodiment are described.

[Submount 10]

The submount 10 can have a rectangular parallelepiped shape. The submount 10 has the smallest dimension in the vertical direction (Y direction). The shape of the submount 10 is not limited to the rectangular parallelepiped shape. The submount 10 can be made of, for example, at least one of silicon nitride, aluminum nitride, and silicon carbide.

The submount 10 conducts the heat produced in the semiconductor laser element 20 to the bottom portion 50*b*. The submount 10 also contributes to adjusting the height of the optical axis of the laser beam emitted from the semiconductor laser element 20.

The dimension in the X direction of the submount 10 can be, for example, equal to or greater than 300 μm and equal to or smaller than 4 mm. The dimension in the Y direction of the submount 10 can be, for example, equal to or greater than 100 μm and equal to or smaller than 500 μm. The dimension in the Z direction of the submount 10 can be, for example, equal to or greater than 200 μm and equal to or smaller than 4 mm.

The upper surface 10*s*1 and the lower surface 10*s*2 of the submount 10 are provided with the first metal film 10*m*1 and the second metal film 10*m*2, respectively. Each of the first metal film 10*m*1 and the second metal film 10*m*2 can be made of, for example, at least one metal selected from the group consisting of Ti, Pt, Cu and Au.

The dimension in the X direction of each of the first metal film 10*m*1 and the second metal film 10*m*2 can be, for example, equal to or greater than 200 μm and equal to or smaller than 3.95 mm. The dimension in the Y direction of each of the first metal film 10*m*1 and the second metal film 10*m*2 can be, for example, equal to or greater than 10 μm and equal to or smaller than 500 μm. The dimension in the Z direction of each of the first metal film 10*m*1 and the second metal film 10*m*2 can be, for example, equal to or greater than 100 μm and equal to or smaller than 3.95 mm.

[Semiconductor Laser Element 20]

The semiconductor laser element 20 can have, for example, a rectangular parallelepiped shape. The dimension in the X direction of the semiconductor laser element 20 can be, for example, equal to or greater than 50 μm and equal to or smaller than 500 μm, preferably equal to or greater than 150 μm and equal to or smaller than 500 μm. The dimension in the Y direction of the semiconductor laser element 20 can be, for example, equal to or greater than 20 μm and equal to or smaller than 150 μm. The dimension in the Z direction of the semiconductor laser element 20 can be, for example, equal to or greater than 50 μm and equal to or smaller than 10 mm, preferably equal to or greater than 1.2 mm and equal to or smaller than 4 mm.

The semiconductor laser element 20 is capable of emitting a violet, blue, green, or red laser beam in the visible range or an infrared or ultraviolet laser beam in the invisible range. The emission peak wavelength of the violet laser beam is preferably in the range of equal to or higher than 380 nm and equal to or lower than 419 nm, more preferably in the range of equal to or higher than 400 nm and equal to or lower than 415 nm. The emission peak wavelength of the blue laser beam is preferably in the range of equal to or higher than 420 nm and equal to or lower than 494 nm, more preferably in the range of equal to or higher than 440 nm and equal to or lower than 475 nm. The emission peak wavelength of the green laser beam is preferably in the range of equal to or higher than 495 nm and equal to or lower than 570 nm, more preferably in the range of equal to or higher than 510 nm and equal to or lower than 550 nm. The emission peak wavelength of the red laser beam is preferably in the range of equal to or higher than 605 nm and equal to or lower than 750 nm, more preferably in the range of equal to or higher than 610 nm and equal to or lower than 700 nm.

Examples of the semiconductor laser element that is capable of emitting a violet, blue or green laser beam include semiconductor laser elements including GaN-based, InGaN-based, and AlGaN-based nitride semiconductor materials. Examples of the semiconductor laser element that is capable of emitting a red laser beam include semiconductor laser elements including InAlGaP-based, GaInP-based, GaAs-based and AlGaAs-based semiconductor materials.

The semiconductor laser element 20 has a semiconductor stack structure including a substrate, a first cladding layer, an emission layer, and a second cladding layer, which are stacked in this order along the +Y direction or the −Y direction. The conductivity type of the first cladding layer is one of p-type and n-type, and the conductivity type of the second cladding layer is the other of p-type and n-type. The substrate is, for example, a semiconductor substrate. The semiconductor stack structure may not include a substrate. The semiconductor stack structure is provided with a first electrode electrically coupled with the first cladding layer and a second electrode electrically coupled with the second cladding layer. By applying a forward voltage between the first and second electrodes such that an electric current at or above the threshold flows through the semiconductor stack structure, a laser beam is emitted from one of two end surfaces of the emission layer which intersect the Z direction, i.e., the emission surface 20*e*. The power of the laser beam 20L increases as the flowing electric current increases. The power of the laser beam 20L may be high, e.g., 10 W or higher, or may be lower than 10 W.

The semiconductor laser element 20 may be mounted in a so-called face-up arrangement where, in the semiconductor stack structure, the substrate is closer to the submount 10 than the emission layer. Alternatively, the semiconductor laser element 20 may be mounted in a so-called face-down arrangement where, in the semiconductor stack structure, the emission layer is closer to the submount 10 than the substrate. Irrespective of whether the wavelength of the laser beam 20L is long or short, the heat produced in the semiconductor laser element 20 can be more efficiently transferred to the submount 10 when the semiconductor laser element 20 is mounted in the face-down arrangement than in the face-up arrangement. When mounted in the face-down arrangement, the semiconductor laser element 20 can be placed on the submount 10 such that the front end portion of the semiconductor laser element 20, which includes the emission surface 20*e*, protrudes beyond the submount 10 as viewed from above. Such an arrangement can prevent the submount 10 from blocking travel of part of the laser beam 20L.

[Lens Supporting Member 30]

The lens supporting member 30 can have, for example, a shape extending astride the semiconductor laser element 20. The material of the lens supporting member 30 can be, for example, the same material as the submount 10. Alternatively, the material of the lens supporting member 30 can be, for example, the same light-transmitting material as the lens 40, which will be described later. The dimension in the X direction of the lens supporting member 30 can be, for example, equal to or greater than 300 μm and equal to or smaller than 4 mm. The maximum dimension in the Y direction of the lens supporting member 30 can be, for example, equal to or greater than 500 μm and equal to or smaller than 2 mm. The dimension in the Z direction of the lens supporting member 30 can be, for example, equal to or greater than 500 μm and equal to or smaller than 1 mm.

[Lens 40]

The lens 40 can generally have, for example, a solid semi-cylindrical shape. The lens 40 can be made of at least one light-transmitting material selected from the group consisting of, for example, glass, silicon, quartz, synthetic quartz, sapphire, transparent ceramic materials, and plastic materials. The light transmittance of the light-transmitting material can be, for example, 60% or higher, preferably 70% or higher, more preferably 80% or higher for the laser beam 20L emitted from the semiconductor laser element 20.

The dimension in the X direction of the lens 40 may be equal to the dimension in the X direction of the lens supporting member 30 or may be greater or smaller than the dimension in the X direction of the lens supporting member 30. The same applies to the dimension in the Y direction of the lens 40. The dimension in the Z direction of the lens 40 can be, for example, equal to or greater than 1 mm and equal to or smaller than 6 mm.

[Base Section 50]

The lateral wall 50*w* of the base 50 can generally have, for example, a hollow prismatic shape as viewed from above. The lateral wall 50*w* may have a hollow cylindrical shape or hollow elliptic cylindrical shape as viewed from above. The lateral wall 50*w* is bonded to the periphery 50*bp* of the flat-plate portion 50*b*1 of the bottom portion 50*b* as shown in FIG. 1D with an inorganic bonding material. The inorganic bonding material can be a brazing material, such as silver brazing filler alloy.

Since the lateral wall 50*w* has the light-transmitting portion 50*t* with the cap 50*c* interposed therebetween as shown in FIG. 1D, the thermal stress generated in the lateral wall 50*w* is less likely to be transmitted to the light-transmitting portion 50*t*, and the light-transmitting portion 50*t* can be prevented from being damaged or destroyed. There is a space in each of the through holes 50*h* between the lateral wall 50*w* and a respective one of the lead terminals 60, and the lateral wall 50*w* and the lead terminals 60 are not in contact with each other. Therefore, even if the lateral wall 50*w* is electrically conductive, the two lead terminals 60 cannot be short-circuited via the lateral wall 50*w*.

The lateral wall 50*w* can be made of, for example, Kovar or SPC (steel plate cold). Kovar is an alloy composed of iron, which is the major constituent, and nickel and cobalt added to the iron. The thermal expansion coefficient of Kovar at around room temperature is relatively low among metals and is close to that of hard glass. The cap 50*c* can be made of, for example, a Fe—Ni alloy. The joining member 50*g* can be made of, for example, low-melting glass. The light-transmitting portion 50*t* can be made of, for example, borosilicate glass.

The dimensions in the X, Y and Z directions of the lateral wall 50*w* can each be, for example, equal to or greater than 5 mm and equal to or smaller than 10 mm.

The bottom portion 50*b* of the base 50 includes a flat-plate portion 50*b*1 and the elevated portion 50*b*2 as shown in FIG. 1D. Each of the flat-plate portion 50*b*1 and the elevated portion 50*b*2 can have, for example, a rectangular parallelepiped shape. When the light-emitting device 100 is placed on the heat sink, the flat-plate portion 50*b*1, which has a rectangular parallelepiped shape, can have an increased contact area with the heat sink and have an improved heat radiation efficiency as compared with a flat-plate portion in the shape of a solid cylinder. Before the recessed portion 50*b*3 is formed, the bottom portion 50*b* can be formed by, for example, pressing.

The bottom portion 50*b* can be made of, for example, at least one metal selected from the group consisting of copper, iron, copper alloys and iron alloys. The bottom portion 50*b*, which is made of such a metal of high thermal conductivity, enables the heat radiated from the semiconductor laser element 20 to be efficiently transferred to the outside.

The dimensions in the X direction and the Z direction of the flat-plate portion 50*b*1 of the bottom portion 50*b* can each be, for example, equal to or greater than 5 mm and equal to or smaller than 10 mm, and the dimension in the Y direction of the flat-plate portion 50*b*1 can be, for example, equal to or greater than 3 mm and equal to or smaller than 10 mm. The dimensions in the X direction and the Z direction of the elevated portion 50*b*2 of the bottom portion 50*b* can each be, for example, equal to or greater than 3 mm and equal to or smaller than 9 mm, and the dimension in the Y direction of the elevated portion 50*b*2 can be, for example, equal to or greater than 1 mm and equal to or smaller than 8 mm. The dimension in the X direction of the recessed portion 50*b*3 can be, for example, equal to or greater than 1 mm and equal to or smaller than 7 mm, the dimension in the Y direction of the recessed portion 50*b*3 can be, for example, equal to or greater than 10 μm and equal to or smaller than 3 mm, and the dimension in the Z direction of the recessed portion 50*b*3 can be, for example, equal to or greater than 1 mm and equal to or smaller than 7 mm.

[Lead Terminals 60]

The two lead terminals 60 allow electric power to be supplied to the laser light source 100A via the plurality of wires 60*w* shown in FIG. 1C. One of the lead terminals 60 is electrically coupled with the upper surface of the semiconductor laser element 20 shown in FIG. 2A via some of the plurality of wires 60*w*. The other lead terminal 60 is electrically coupled with the first metal film 10*m*1 shown in FIG. 2A via the remaining wires 60*w*. The first metal film 10*m*1 is electrically coupled with the lower surface of the semiconductor laser element 20. Each of the upper and lower surfaces of the semiconductor laser element 20 is provided with an electrode.

Each of the lead terminals 60 can have the shape of a solid cylinder. Each of the lead terminals 60 can be made of, for example, a Fe—Ni alloy that has a copper core. The copper core is arranged along the central axis of the solid cylinder of the lead terminals 60. In other words, a Fe—Ni alloy in the shape of a hollow cylinder is provided around copper in the shape of a solid cylinder. Since the lead terminals 60 include copper, which is a material of low electrical resistance, at the core, a large electric current is allowed to flow through each of the lead terminals 60.

The diameter in the XY plane of each of the lead terminals 60 can be, for example, equal to or greater than 0.6 mm and equal to or smaller than 2.0 mm. The dimension in the Z direction of each of the lead terminals 60 can be, for example, equal to or greater than 5 mm and equal to or smaller than 20 mm. The dimension of the gap between the two lead terminals 60 can be, for example, equal to or greater than 1 mm and equal to or smaller than 8 mm.

[Lead Holding Member 70]

The lead holding member 70 is bonded to the lateral wall 50*w* with an inorganic bonding material such that the through holes 70*h* in the lead holding member 70 overlap the through holes 50*h* in the lateral wall 50*w* as shown in FIG. 1D. The inorganic bonding material can be a brazing material, such as silver brazing filler alloy. The lead holding member 70 can be made of, for example, mild steel, which is iron containing carbon in the proportion from 0.05% to 0.3% inclusive, or Kovar.

The joining members 72 can be made of, for example, soft glass. Mild steel and Kovar are electrically-conductive materials, and soft glass is an electrical insulating material. Due to the joining members 72, short circuit between the two lead terminals 60 can be prevented while the sealing performance of the package can be improved.

The thermal expansion coefficient of the lead holding member 70 can be designed so as to be, for example, equal to or greater than the thermal expansion coefficient of the lateral wall 50*w* and equal to or smaller than the thermal expansion coefficient of the lead terminals 60. In such a case, the lead holding member 70 relieves the thermal stress between the lateral wall 50*w* and the lead terminals 60, and thus, the durability of the package against the thermal stress improves.

The dimension in the X direction of the lead holding member 70 can be, for example, equal to or greater than 5 mm and equal to or smaller than 10 mm, the dimension in the Y direction of the lead holding member 70 can be, for example, equal to or greater than 2 mm and equal to or smaller than 8 mm, and the dimension in the Z direction of the lead holding member 70 can be, for example, equal to or greater than 0.5 mm and equal to or smaller than 5 mm.

[Cover 80]

The cover 80 is joined to the upper surface of the lateral wall 50*w* with the reinforcement member 52 interposed therebetween as shown in FIG. 3A. The cover 80 serves together with the base 50 and the lead holding member 70 to seal up the space in which the laser light source 100A is housed. Note that the cover 80 may be omitted when it is not necessary to encapsulate the laser light source 100A. The dimensions in the X direction and the Z direction of the cover 80 can each be, for example, equal to or greater than 5 mm and equal to or smaller than 10 mm, and the dimension in the Y direction of the cover 80 can be, for example, equal to or greater than 0.05 mm and equal to or smaller than 1 mm.

The reinforcement member 52 improves the sealing performance achieved by the cover 80. If without the reinforcement member 52, there is a gap between the upper surface of the lateral wall 50*w* and the cover 80. The cover 80 and the reinforcement member 52 can be made of, for example, Kovar. When the cover 80 and the reinforcement member 52 are made of the same material as the lateral wall 50*w*, these components have equal thermal expansion coefficients and, therefore, the durability of the package against the thermal stress improves.

Among the other constituents of the package of the light-emitting device 100 according to the present embodiment, details of the lateral wall 50*w*, the two lead terminals 60 and the lead holding member 70 are disclosed in, for example, US Patent Publication No. 2021/0203127. The disclosure of US Patent Publication No. 2021/0203127 is incorporated herein by reference in its entirety.

A light-emitting device of the present disclosure can be used in, for example, laser processing machines, projectors, and light sources for lighting devices.

It is to be understood that, although certain embodiments of the present invention have been described, various other embodiments and variants may occur to those skilled in the art that are within the scope and spirit of the invention, and such other embodiments and variants are intended to be covered by the following claims.

What is claimed is:

1. A light-emitting device comprising:

a semiconductor laser element;

a base having a bottom portion supporting the semiconductor laser element and a lateral wall surrounding the semiconductor laser element with the lateral wall being bonded to the bottom portion, the lateral wall including a light-transmitting portion configured to transmit a laser beam emitted from the semiconductor laser element;

a cover, the cover and the base together defining an encapsulation space in which the semiconductor laser element is encapsulated;

two lead terminals penetrating through the lateral wall of the base, one end of each of the lead terminals being located inside the encapsulation space;

a submount arranged between the semiconductor laser element and the base, the submount having an upper surface and a lower surface with the upper surface of the submount supporting the semiconductor laser element; and a metal film provided on the lower surface of the submount, wherein the bottom portion of the base has an upper surface defining a recessed portion located between the two lead terminals as viewed from above, the recessed portion has a flat bottom surface over which the semiconductor laser element is placed the metal film and the bottom surface of the recessed portion are bonded to each other with a bonding material, a thickness of the metal film is greater than a depth of the recessed portion, in a separation direction in which the two lead terminals are separated as viewed from above, a width of the metal film is equal to or smaller than a width of the recessed portion, and in the separation direction, a width of the submount is greater than a width of the recessed portion and is smaller than a dimension of a gap between the two lead terminals.

2. The light-emitting device of claim 1, wherein the base has a flat lower surface, and the bottom surface of the recessed portion is parallel to the lower surface of the base.

3. The light-emitting device of claim 1, wherein a height of the lateral wall is equal to or greater than 0.2 times and equal to or smaller than 0.5 times a length of an outside perimeter of the lateral wall, the bottom portion includes a flat-plate portion and an elevated portion together defining a step, the elevated portion including the upper surface defining the recessed portion, and a dimension of the step in a normal direction of the upper surface of the elevated portion is equal to or greater than 0.25 times and equal to or smaller than 0.5 times a height of the lateral wall.

4. The light-emitting device of claim 1, wherein the semiconductor laser element is configured to emit the laser beam having a wavelength equal to or higher than 440 nm and equal to or lower than 475 nm.

5. The light-emitting device of claim 1, wherein the semiconductor laser element is configured to emit the laser beam having a wavelength equal to or higher than 420 nm and equal to or lower than 450 nm, and a power equal to or greater than 10 W.

6. The light-emitting device of claim 1, further comprising a lens located inside the encapsulation space, the lens being configured to collimate or converge the laser beam emitted from the semiconductor laser element.

7. The light-emitting device of claim 1, further comprising:

a lens supporting member supported by the submount; and a lens supported by the lens supporting member, the lens being configured to collimate or converge the laser beam emitted from the semiconductor laser element.

* * * * *